United States Patent
Lawlis

(10) Patent No.: US 10,048,302 B2
(45) Date of Patent: Aug. 14, 2018

(54) VEHICLE COMMUNICATIONS SIGNAL DIAGNOSTICS USING RADIO RECEIVER

(71) Applicant: FORD GLOBAL TECHNOLOGIES, LLC, Dearborn, MI (US)

(72) Inventor: James Martin Lawlis, Grosse Pointe Farms, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 265 days.

(21) Appl. No.: 15/043,907

(22) Filed: Feb. 15, 2016

(65) Prior Publication Data

US 2017/0234916 A1   Aug. 17, 2017

(51) Int. Cl.
*G01R 29/08* (2006.01)
*G01R 31/00* (2006.01)

(52) U.S. Cl.
CPC ..... *G01R 29/0892* (2013.01); *G01R 29/0878* (2013.01); *G01R 31/007* (2013.01)

(58) Field of Classification Search
CPC .............. G01R 29/0892; G01R 31/007; G01R 29/0878
See application file for complete search history.

(56) References Cited

U.S. PATENT DOCUMENTS

| 6,021,366 A * | 2/2000 | Fieramosca | .......... G01R 31/007 701/29.6 |
| 8,699,356 B2 | 4/2014 | Smart et al. | |
| 9,046,577 B2 | 6/2015 | Agapiou et al. | |
| 2013/0136007 A1 | 5/2013 | Jiang et al. | |
| 2015/0008938 A1* | 1/2015 | Kim | .................... H04L 25/0266 324/543 |

FOREIGN PATENT DOCUMENTS

| CN | 204103938 U | 1/2015 |
| JP | S6385373 A | 4/1988 |

OTHER PUBLICATIONS

Intellectual Property Office, Search Report for the corresponding GB Patent Application No. GB1702411.8, dated May 26, 2017.

* cited by examiner

*Primary Examiner* — Thomas P Ingram
(74) *Attorney, Agent, or Firm* — Frank MacKenzie; Brooks Kushman P.C.

(57) ABSTRACT

An automotive diagnostic tool includes an antenna, a speaker, and a controller. In response to a vehicle diagnostic request, the controller generates a carrier frequency that corresponds to a predetermined frequency associated with electromagnetic emissions from an imbalanced differential channel in the vehicle. The controller alternately enables and disables the differential channel resulting in an audio signature and a baseline audio signature. The controller demodulates signals from the antenna based on the carrier frequency and outputs the demodulated signal to the speaker for analysis by a listener. The demodulated signal may be further processed by the controller to identify emissions from the communication network.

20 Claims, 3 Drawing Sheets

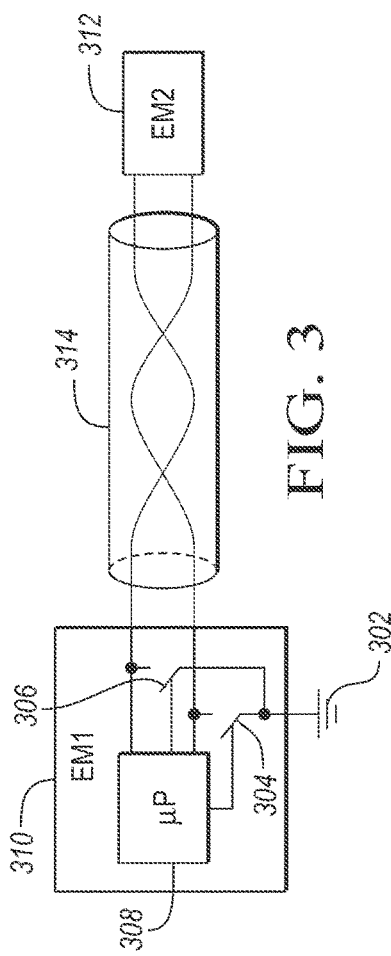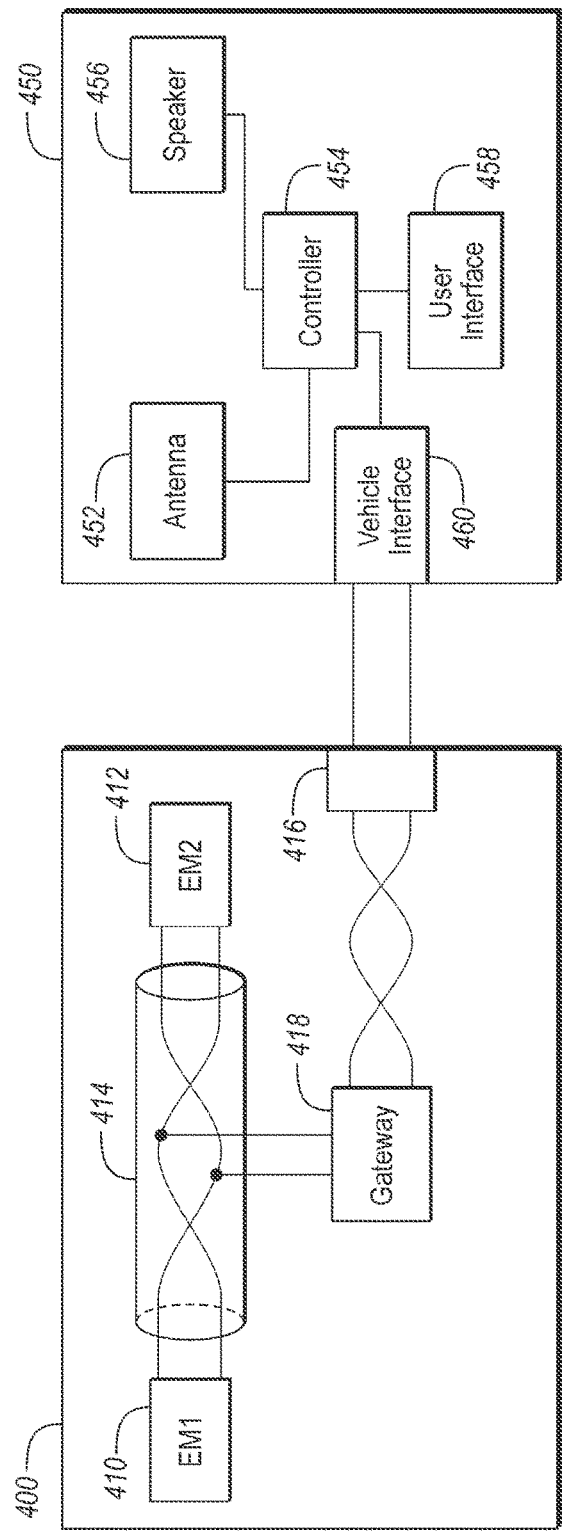

VEHICLE COMMUNICATIONS SIGNAL DIAGNOSTICS USING RADIO RECEIVER

TECHNICAL FIELD

This application generally relates to detecting electromagnetic emissions from conductors in a vehicle.

BACKGROUND

Modern vehicles include many electronic modules to perform various functions. The electronic modules may interact with one another to exchange signals and data. Much of the communication between modules is via wired connections.

SUMMARY

In some configurations, an automotive diagnostic tool includes a controller configured to, in response to receiving input requesting diagnosis of a differential signal channel, demodulate an antenna signal at a frequency in a predetermined range corresponding to electromagnetic emissions caused by the differential signal channel being imbalanced, and alternately output a baseline audio signature and an audio signature that includes, as a result of the differential signal channel being imbalanced, a disturbance distinct from the baseline audio signature.

Some configurations may include one or more of the following features. The automotive diagnostic tool may include a display, in which the controller is programmed to output a message indicative of the differential signal channel being diagnosed. The automotive diagnostic tool in which the controller is configured to communicate with a vehicle controller and programmed to alternately request the vehicle controller to enable and disable the differential signal channel such that the differential signal channel alternates between a period of signal activity when enabled and a period of signal inactivity in which conductors of the differential signal channel are maintained at a generally constant voltage level to minimize electromagnetic emissions from the differential signal channel when disabled. The automotive diagnostic tool in which the controller is programmed to output the baseline audio signature as a corresponding audio signal that results from the differential signal channel being disabled. The automotive diagnostic tool in which the controller is programmed to output the audio signature as a corresponding audio signal that results from the differential signal channel being enabled. The automotive diagnostic tool in which the controller is programmed to request the vehicle controller to transmit a predetermined signal over the differential signal channel when enabled, in which the predetermined signal is configured to cause electromagnetic emissions in the predetermined range when the differential signal channel is imbalanced. The automotive diagnostic tool in which the controller is programmed to request the vehicle controller to alternate between disabling the differential signal channel for a first predetermined time interval and enabling the differential signal channel for a second predetermined time interval. The automotive diagnostic tool in which the controller is configured to change the frequency in predetermined increments within the predetermined range at predetermined time intervals.

In some configurations, an automotive diagnostic tool includes a controller configured to, in response to receiving input requesting diagnosis of a differential signal channel, demodulate an antenna signal at a frequency in a predetermined range corresponding to electromagnetic emissions caused by an imbalance of the channel and output a diagnostic signal in response to identifying a presence of a disturbance in an audio signature that is absent from a baseline audio signature when the channel is balanced.

Some configurations may include one or more of the following features. The automotive diagnostic tool in which the controller is programmed to identify the presence of the disturbance by processing the audio signature and the baseline audio signature using a discrete Fourier transform to generate frequency component magnitudes for frequencies present in the audio signature and the baseline audio signature. The automotive diagnostic tool in which the controller is configured to communicate with a vehicle controller and programmed to alternately request the vehicle controller to enable and disable the differential signal channel such that the differential signal channel alternates between a period of signal activity that results in the audio signature and a period of signal inactivity that results in the baseline audio signature in which conductors of the differential signal channel are maintained at a generally constant voltage level to eliminate electromagnetic emissions from the differential signal channel. The automotive diagnostic tool in which the controller is programmed to generate a first set of frequency component magnitudes that correspond to the baseline audio signature when the differential signal channel is selectively disabled and a second set of frequency component magnitudes that correspond to the audio signature that results when the differential signal channel is selectively enabled. The automotive diagnostic tool in which the controller is programmed to output the diagnostic signal in response to one or more frequency component magnitudes of the second set being greater than corresponding frequency component magnitudes of the first set by greater than a predetermined amount. The automotive diagnostic tool in which the controller is programmed to request the vehicle controller to transmit a predetermined signal over the differential signal channel when enabled, in which the predetermined signal is configured to cause electromagnetic emissions in the predetermined range in a presence of the imbalance.

In some configurations, a method for diagnosing wiring issues in a vehicle includes demodulating by a controller an antenna signal at a frequency in a predetermined range corresponding to electromagnetic emissions caused by an imbalance of a differential signal channel. The method also includes outputting by the controller during alternating time periods a baseline audio signature and an audio signature that includes, as a result of the differential signal channel being imbalanced, a disturbance distinct from the baseline audio signature.

Some configurations may include one or more of the following features. The method may include identifying by the controller a presence of a disturbance in an audio signature that is absent from a baseline audio signature collected when the differential signal channel is balanced. The method may include processing by the controller the audio signature and the baseline audio signature using a discrete Fourier transform to generate frequency component magnitudes for frequencies present in the audio signature and the baseline audio signature. The method may include outputting by the controller a diagnostic signal in response to one or more frequency component magnitudes of a first set of frequency component magnitudes, that correspond to the baseline audio signature when the differential signal channel is selectively disabled, being greater than corresponding frequency component magnitudes of a second set of frequency component magnitudes, that correspond to the audio signature that results when the differential signal channel is selectively enabled, by greater than a predetermined amount. The method may include requesting by the controller a vehicle controller to enable and disable the differential signal channel during alternating time periods such that the differential signal channel alternates between a period of signal activity when enabled to cause the audio signature and a period of signal inactivity in which conductors of the differential signal channel are maintained at a generally constant voltage level to minimize electromagnetic emissions from the differential signal channel when disabled to cause the baseline audio signature. The method may include requesting by the controller the vehicle controller to transmit a predetermined signal over the differential signal channel when enabled, in which the predetermined signal is configured to cause electromagnetic emissions in the predetermined range in a presence of the imbalance.

BRIEF DESCRIPTION OF THE DRAWINGS

FIG. 3 depicts a block diagram for a controller the selectively enables and disables a communication network in the vehicle.

FIG. 4 depicts a vehicle coupled to a diagnostic tool that is configured to identify radiated emissions from communication networks in the vehicle.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
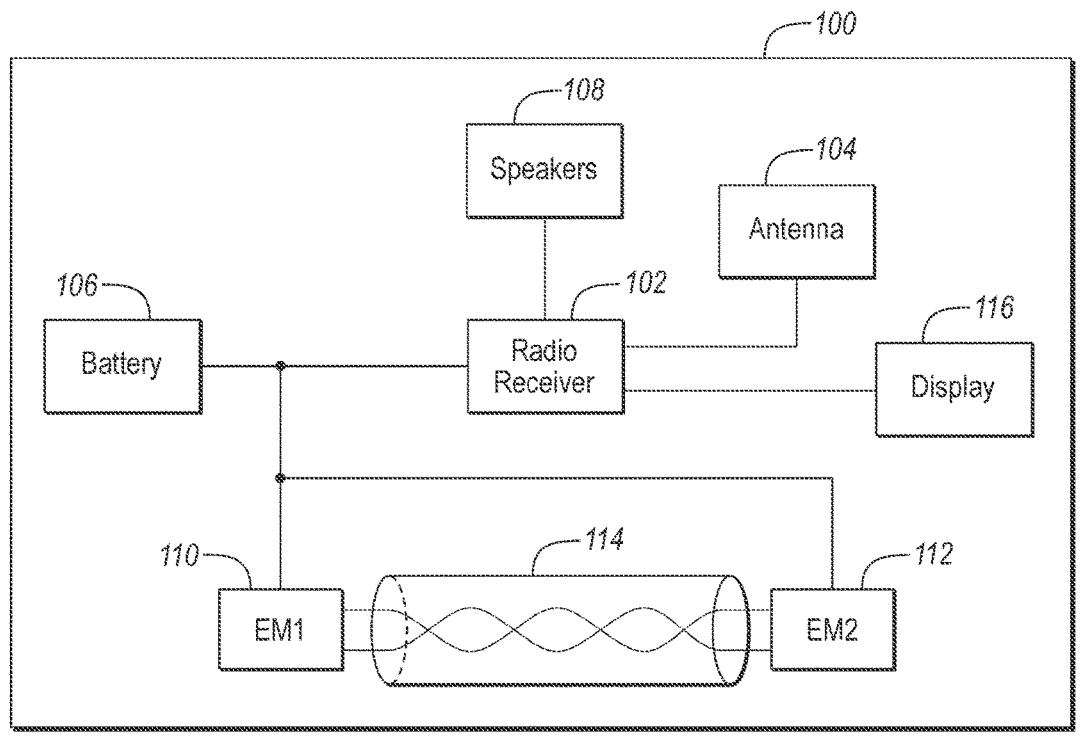
FIG. 1 is a possible vehicle configuration including a radio receiver.

FIG. 1 depicts an exemplary block diagram of a vehicle 100. The vehicle 100 may include a radio receiver controller 102 that is coupled to one or more antennas 104. The vehicle 100 may include a battery 106. The radio receiver controller 102 may be coupled to the battery 106 and receive power from the battery 106 to operate. The radio receiver controller 102 may be configured to receive signals from the antenna 104 in various frequency spectrums. For example, the radio receiver controller 102 may be configured to receive signals in the Amplitude Modulation (AM) frequency band (e.g., 500 kHz-1700 kHz). The radio receiver controller 102 may also be configured to receive signals in the Frequency Modulation (FM) frequency band (e.g., 88 MHz-108 MHz). The antennas 104 may be configured to receive signals in the AM and FM frequency bands.

The radio receiver controller 102 may include one or more control inputs that allow an operator to select a carrier frequency at which to demodulate the received waveform. The control inputs may configure the radio receiver controller 102 to filter a signal from the antenna 104 in a selected frequency range about the carrier frequency. The signal may then be demodulated to extract the broadcast signal.

The radio receiver controller 102 may include circuitry to demodulate the received signal from the antenna 104. The radio receiver controller 102 may include circuitry to generate a carrier frequency for demodulating the signals received from the antenna 104. The demodulation circuitry may depend on the frequency band (e.g., AM or FM) and multiple sets of circuitry may be present to accommodate the different frequency bands. The radio receiver controller 102 may be configured to perform AM signal demodulation in all frequency bands, including FM. The radio receiver controller 102 may include a processor and memory (volatile and non-volatile). The radio receiver controller 102 may be configured to select the frequency band and enable the appropriate demodulation circuitry. The radio receiver controller 102 may be configured to select and generate the carrier frequency and interface with the corresponding circuitry. In various configurations, functions may be implemented in circuitry or may alternatively be programmed in memory and executed by the processor.

The vehicle 100 may include one or more speakers 108 that are electrically coupled to the radio receiver controller 102. After demodulation and filtering the input signal, the radio receiver controller 102 may output the signal to the speakers 108 to provide audible sound to the operator.

The vehicle 100 may include a plurality of electronic modules to perform various functions. The electronic modules may be present to control operation of an engine, a transmission, and a braking system. For example, the vehicle 100 may include a first electronic module 110 and a second electronic module 112. Signals and data may be communicated between the first and second electronic modules 110, 112. The signals may be transferred via a wired connection 114 between the first and second electronic modules 110, 112.

The vehicle 100 may further include a display module 116. The display module 116 may be configured to display messages and indications to an operator of the vehicle 100. For example, the display module 116 may display a presently selected carrier frequency, a selected communication link that is under test, and a result of diagnostic testing (e.g., which communication link has failed testing). The display module 116 may include a user interface to allow the operator of the vehicle 100 to control various aspects of operation. The display module may include a display screen that may be a touch-screen that allows the operator to input commands to the radio receiver 102.

The wired connection 114 may be part of a vehicle network. The vehicle network may include a plurality of channels for communication. The vehicle network may include a serial bus channel such as a Controller Area Network (CAN) link. One of the channels of the vehicle network may include an Ethernet network defined by Institute of Electrical and Electronics Engineers (IEEE) 802 family of standards. Different signals may be transferred over different channels of the vehicle network. For example, video signals may be transferred over a high-speed channel (e.g., Ethernet) while control signals may be transferred over the CAN link. One of the channels may be implemented according to a Low Voltage Differential Signaling (LVDS) protocol. The vehicle network may include any hardware and software components that aid in transferring signals and data between modules. The vehicle network is not shown in FIG. 1 but it is implied that the vehicle network may connect to any electronic module that is present in the vehicle 100.

The channels of the vehicle network may be configured to communicate according to a specific protocol (e.g., CAN, Ethernet). The differential signals communicated via the wiring may fall within a predetermined range of frequencies. Electronic modules that are configured to communicate over the channel may be configured to operate according to the specific protocol. A maximum frequency may be derived from a nominal bit time for the communication protocol. The nominal bit time may define the maximum frequency at which the signal may change. A repeating pattern in which the signal alternates states at each nominal bit time may represent the maximum frequency.

The wired connection 114 may be a discrete, possibly dedicated, connection between the first and second electronic modules 110, 112. For example, the first and second electronic modules may communicate with on another via a pulse-width modulated (PWM) signal. For example, the first electronic module 110 may be a brake controller and the second electronic module may be a wheel speed sensor. The wheel speed sensor may output a variable frequency signal that varies as the wheel speed varies. The system and methods described herein are generally applicable to any communication network utilizing differential signals.

Electrical signals transferred via wired connections may create electromagnetic interference (EMI) issues. Time-varying electrical currents passing through a conductor may create an electromagnetic field around the conductor. The electromagnetic field may then interact with other conductors to induce currents in the other conductors. In general, a conductor is capable of causing interference and is also susceptible to interference from other conductors. Various techniques exist to minimize the amount of noise generated by conductors and to minimize the amount of noise that is received.

Electromagnetic emissions from a conductor are influenced by the rate of change of the current flowing through the conductor. The rate of change of the signal carried by the conductor affects the magnitude of the emissions. One way to reduce emissions is to limit the rate of change of signals carried by the conductor. For example, the rise and fall time of the signal may be limited to be greater than a predetermined time. However, to achieve high-speed communications requires an increased rate of change in the signal. Electromagnetic emissions may be greatly impacted by the signal transitions.

To reduce EMI, electrical signals may be transferred as differential signals. Differential signals may be implemented by a pair of conductors. The electronic modules extract the signals as the voltage difference across the pair of conductors. The conductors of the differential circuit may be twisted-pair wires. The differential circuit configuration minimizes the impact of common-mode signals affecting the conducted signal. Common-mode signals are those signals that affect both of the conductors of the differential pair in the same manner (e.g., ground differential, voltage offsets, radiated emissions). The signals sent over the conductors must be mirror images of one another such that any common-mode frequency fields cancel one another.

Further techniques of reducing EMI include shielding conductors. A shielded conductor is a conductor that is enclosed within a conductive layer. For example, several conductors may be enclosed by a common conductive layer or shield. The shield may include a connection to a ground plane at one or each end of the conductors. The shield around the conductors acts to reduce electrical radiation caused by the enclosed conductors and reduces the amount of interference from other sources on the enclosed conductors. Other techniques of reducing EMI are possible.

A vehicle may be designed to reduce the amount of EMI caused by the vehicle and to reduce the effect of EMI from other sources of impacting vehicle performance. However, during operation, the EMI may be compromised due to a variety of issues. For example, conductor shields may become damaged such that the shield is no longer effective at preventing noise radiating from the enclosed conductors. Faults with the differential circuits may cause imbalances between the differential signals leading to radiated electromagnetic emissions. Such faults may be due to internal circuitry failures or breaks in the conductors that add resistance to one of the conductors. These types of issues are often intermittent and may not continuously cause problems. Further, the issues may not be readily reproducible. As such, these types of EMI issues may be difficult to detect. A vehicle owner having EMI issues may experience intermittent issues that may be difficult to diagnose by a service facility.

Emissions from the differential signals may be affected by a number of variables. The differential signal is made up of two signals of equal magnitude but out of phase with one another. A common mode signal, which is the sum of the two differential signals, may impact electromagnetic emissions from the differential communication link. When the differential signals are balanced, the common mode signal appears as a constant magnitude. When the differential signals are imbalanced, there is a time-varying (e.g., AC) portion to the common mode signal. This time-varying portion causes electromagnetic emissions from the differential communication link. In many cases, the communication network may still be functional even though emissions may be increased. Factors that may cause an imbalance include mismatched rise/fall times and mismatched amplitudes of the differential signal pairs. Imbalances may be caused by an impedance mismatch on the signal lines.

Figure 2:
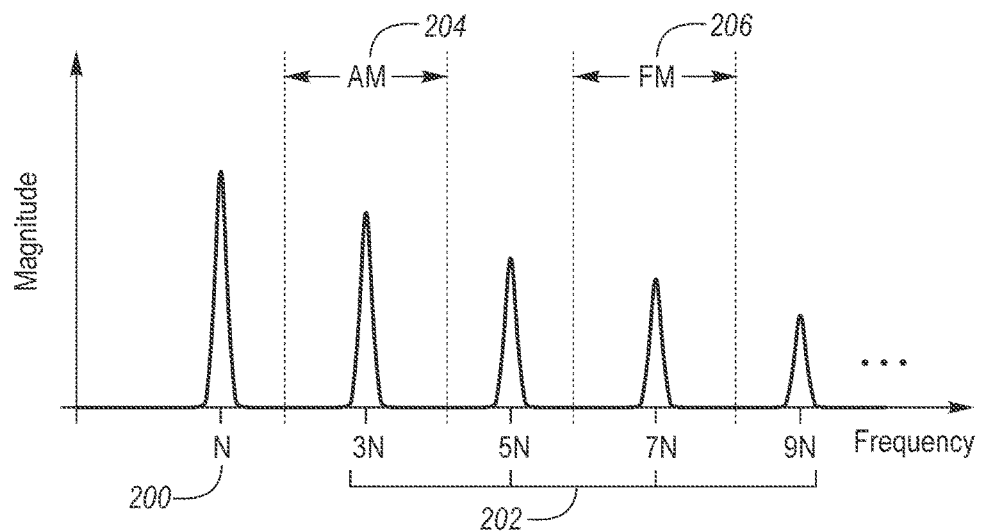
FIG. 2 is a plot depicting a possible noise frequency spectrum caused by imbalanced wiring in a vehicle.

A signal may be represented in the frequency domain as a sum of waveforms having different frequencies and magnitudes. Each of the waveforms may be sinusoidal with a frequency and a magnitude. The radiated electromagnetic emissions from an imbalanced differential circuit may be depicted as a plot of frequency component magnitudes, such as in FIG. 2 shown for a typical square wave signal. A fundamental frequency 200 of the emitted signal may be present at which radiated emissions may generally have greatest magnitude. In addition to the fundamental frequency 200, harmonic frequencies 202 may be present. Note that for a square wave signal the harmonics appear at the odd number harmonics. These harmonic frequencies 202 may be integer multiples of the fundamental frequency 200. In some case, the fundamental frequency 200 and/or the harmonic frequencies 202 may fall within all frequency bands including the AM frequency band 204 and/or the FM frequency band 206. When the frequencies fall within the AM frequency band 204 or the FM frequency band 206, the signals may interfere with the normal signals. The result may be a buzz or tone at the fundamental frequency 200 or the harmonic frequencies 202. In most cases, the fundamental frequency 200 may be greater than frequencies in the audible range.

The impact of radiated emissions from conductors in the vehicle 100 may be noticed as noise output from the radio receiver controller 102 to the speakers 108. The fundamental frequency 200 of the radiated emissions may depend upon the frequency of the signals passing through the conductors. The magnitude of the radiated emissions at a given frequency may depend on a variety of factors. The location of the conductor radiating electromagnetic energy may impact the signal at the antenna 104. The type of signal conducted on the conductor may influence the radiation spectrum. For example, a conductor transmitting square waves (e.g., with fast rise and fall times) may have higher radiated emissions than those transmitting sinusoidal signals or slowly varying signals. The type of waveform conducted may affect the magnitude of the harmonic frequencies 202. The magnitude of the radiated emissions may also depend upon the magnitude of current flowing through the conductors such that the emissions may increase when the current magnitude increases. Emissions may be affected by the length of the conductors and the loads that are connected to the conductors. Further, the impedance difference between the differential signal pairs may affect the magnitude of the emissions.

The impact of radiated emissions due to imbalanced differential circuits includes interference with the radio receiver controller 102. For example, a buzz or tone may be heard when tuned to some frequencies or frequency ranges. In other situations, the magnitude of the radiated emissions from the vehicle may dominate the signal such that the desired broadcast channel cannot be discerned. Other impacts may be that the communication between the electronic modules 110, 112 may be less reliable. The circuit may be more susceptible to emissions from other sources that may degrade the communication quality. Further, the condition may be intermittent and cause customer dissatisfaction.

Diagnosis of imbalanced communication networks can be difficult. Service technicians may find it difficult to access communication lines within the vehicle. In some vehicles, a gateway may be present between the diagnostic port and the actual communication networks making it difficult to access the conductors of the communication networks. Diagnosis of EMI issues may be improved by implementing a tool to detect such electromagnetic emissions from vehicle circuits. In the event of compromised wiring or shielding, an increase in radiated emissions by the affected conductors may be detectable. One device that may be utilized to detect faulty wiring within the vehicle is the radio receiver controller 102 that is present in nearly every vehicle produced.

The radio receiver controller 102 may be tuned to various frequencies in different modes of operation (e.g., AM, FM). In some configurations, the radio receiver controller 102 may be configured to monitor for amplitude modulated signals in the FM frequency band. Audible signals are demodulated from the electromagnetic waves received by the antenna 104. The electromagnetic signals are filtered and demodulated and the resulting signal is output to the speakers 108. In the presence of electromagnetic noise, the resulting audible output may not sound clear to a listener. The audible output may be corrupted by a tone, buzz, or static. In some cases, the noise may overwhelm the desired radio signal such that the expected audible output cannot be discerned clearly. This is particularly true when the frequency of the interference signal is at the same frequency that the radio receiver controller 102 is tuned to.

As such, electrical interference problems may be detected by tuning the radio receiver controller 102 to various frequencies and listening to the resulting audible output. The carrier frequency that the radio receiver controller 102 is tuned to may provide an indication of the type of conductor that is affected. For example, a CAN communication link may cause interference at a first predetermined frequency and harmonic frequencies thereof. A vehicle Ethernet interface may be cause interference at a second predetermined frequency and harmonic frequencies thereof. The communication channel that is compromised may be identified by the carrier frequency at which the radio receiver controller 102 is tuned to. This method may aid a service technician in identifying which conductors are causing problems.

In some configurations, the signals from the antenna may be demodulated as an AM signal in all of the frequency bands (including FM). As such, the radio receiver controller 102 may be configured to perform AM modulation over a wider range of frequencies than in a typical radio system.

Further diagnosis may be performed by the service technician to determine the particular conductors that are causing the problem. The selected carrier frequency may identify the type of communication link that is causing the interference. The vehicle 100 may include more than one such communication link. For example, the vehicle 100 may include multiple CAN links and an Ethernet network. To identify which of the links is compromised, the bus conductors for each network may be shorted together. When the noise is no longer identified in the audio output, the compromised network may be identified and repaired.

Each communication link in the vehicle may be characterized as to the frequency or frequency range of radiated emissions. Such characterization may be done analytically or via testing. For example, initial test results for a typical CAN system indicate that radiated emissions fall within the AM band in a frequency range of 800 KHz to 1.6 MHz and in the long wave (LW) frequency band in a frequency range of 145 KHz to 285 KHz. Initial test results for a typical Ethernet communication link indicate that radiated emissions fall within the AM band in a frequency range of 560 KHz to 700 KHz. Communication links may be configured to communicate at different bit rates which affect the frequency of the emissions. Further, the specific data traffic on the communication link may cause the radiated frequency to vary. In addition, frequency component magnitudes may be identified at which radiated emissions may be identified. In some configurations, controllers that are coupled to the communications links may be configured to transmit a predetermined data pattern while in a diagnostic mode. The predetermined data pattern may be configured to cause radiated emissions at a particular frequency. Such a configuration may permit detection of wiring issues on the communication link as the frequency of the radiated emissions may be more consistent.

In a diagnostic mode, a diagnostic command may be sent to controllers in the vehicle 100, including the radio receiver controller 102. The diagnostic command may include information regarding the communication link to be tested. Upon receipt of the diagnostic command, controllers 110, 112 coupled to the communication link 114 to be tested may enter a receive-only mode. A master controller may enter a transmit mode in which a predetermined message is transmitted for a predetermined time period. The radio receiver controller 102 may be requested to tune to a carrier frequency at which the radiated emissions are expected for the communication link to be tested. The radio receiver controller 102 may also be requested to scan through a range of frequencies at a predetermined rate. The predetermined rate may be selected to allow a listener adequate time to listen for possible noise issues. The operator may then be prompted to listen for unusual sounds or tones that may be indicative of an imbalanced communication circuit.

In other configurations, the electronic modules may be configured to either internally short the bus conductors or otherwise disable communication on the bus. This may permit the fault to be identified without physically shorting bus conductors together. FIG. 3 depicts a first controller 310 and a second controller 312 coupled to a communication link 314. In this configuration, the first controller 310 is configured with a first switching device 304 and a second switching device 306. The switching devices 304, 306 may be implemented as solid-state devices. The switching devices 304, 306 may be selectively controller by a processor 308 in the first controller 310. When requested by a diagnostic tool, the processor 308 may be programmed to selectively connect the conductors of the communication bus 314 to ground 302. In some configurations, each controller coupled to the communication bus 314 may be similarly configured. The result is that conductors of the communication bus are maintained at a generally constant voltage level which reduces the electromagnetic emissions from the communication link 314. The first controller 310 may be configured to activate the switching devices in response to a diagnostic request from another module or a diagnostic tool external to the vehicle 100.

When the first controller 310 is configured to selectively disable communication on the communication link 314, it is possible to identify the source of radiated emissions. The audio output may alternate between periods with the communication bus enabled and disabled. When distortion or noise is present during the communication bus enabled periods and not during the periods when the communication bus is disabled, there is a high probability that the selected communication bus is degraded. During the sequence, the selected communication bus may be identified with a message from the display module 116.

In some configurations, the electronic modules may be configured to disable communication on the communication link 314 by reconfiguring the output pins. For example, many controllers have configurable pins that may operate as communication channels, digital input/outputs, or timer input/outputs. In other configurations, communication circuitry may include various test modes that may be activated. In some configurations, the processor 308 may be programmed to output a specific waveform on the conductors of the communication network 314 when the channel is enabled. For example, the port coupled to the conductor of the communication network 314 may be reconfigured as a square-wave output at a particular frequency. A benefit of this configuration is that each communication network could be tested with a similar test signal. The actual characteristics of the radiated emissions depend upon the impedance and length of the conductors. The test signal for each module could be tuned such that the radiated emissions are expected at the same frequency for each test.

In some configurations, a communication channel may be alternately operated in an enabled mode and a disabled mode in response to receiving input requesting diagnosis of a differential signal channel. That is, the communication channel may be enabled and disabled during alternating time periods. The time period when the communication channel is enabled may be characterized by a period of signal activity on the communication channel. The time period when the communication channel is disabled may be characterized by a period of signal inactivity on the communication channel. The radio receiver 102 may output the audio signal corresponding to each mode of operation. The audio signal when the communication channel is disabled results in a baseline audio signature. The audio signal when the communication channel is enabled may include a disturbance distinct from the baseline audio signature when the communication channel is imbalanced. A service technician or vehicle operator may be able to discern differences between the baseline audio signature and the audio signal resulting from the enabled communication channel. For example, the audio signal in the enabled mode may include a buzz or noise not present in the baseline audio signature.

In some configurations, the testing may be automated by the radio receiver controller 102. The radio receiver controller 102 may be programmed to generate the frequency component magnitudes corresponding to the audio output at a given carrier frequency. This may be implemented as a discrete Fourier transform that results in frequency components magnitude values for a range of frequencies. In some configurations, the frequency component magnitudes at predetermined frequencies may be compared to a predetermined threshold value. If the selected frequency component magnitudes exceed the predetermined threshold value, a diagnostic indication may be provided for the selected communication channel.

In some configurations, the radio receiver controller 102 may compare the frequency component magnitudes when the communication link is enabled and disabled. A first set of frequency component magnitudes may result from the communication link being disabled. The radio receiver controller 102 may process the baseline audio signature that results when the communication link is disabled. A second set of frequency component magnitudes may result from the communication link being enabled. The radio receiver controller 102 may process the resulting audio signal that results during the enabled mode. The first set and the second set may be compared. A diagnostic indication for the selected communication link may be output when one or more frequency component magnitudes of the second set are greater than corresponding frequency component magnitudes of the first set by greater than a predetermined amount. This is indicative of the noise being reduced when the communication link is disabled.

In an automated configuration, the radio receiver controller 102 may perform the frequency component magnitude comparison for each of the communication links in the vehicle 100. The carrier frequency may be periodically adjusted to correspond to one of the communication links (e.g., 114). For example, the carrier frequency may be changed in predetermined increments within a predetermined frequency range at predetermined time intervals.

In other configurations, the radio receiver controller 102 function may be implemented in a diagnostic tool. FIG. 4 depicts an automotive diagnostic tool 450 than includes a radio receiver function. For example, a service diagnostic tool 450 may be augmented with and antenna 452, a controller 454, and a speaker 456. The diagnostic tool 450 may improve diagnosis because the antenna 452 may be movable relative to the vehicle 400. As the diagnostic tool 450 is moved, any noise patterns may change such that the noise increases as the diagnostic tool 450 is placed closer to the emitter. This may further help to identify the potential source of the emissions.

The vehicle 400 may include a first controller 410 and a second controller 412 coupled to a communication network 414. The first controller 410 and the second controller 412 may be configured to selectively couple conductors of the communication network 414 to a generally constant voltage level to minimize radiated emissions (discussed in conjunction with FIG. 3). The vehicle 400 may include a gateway module 418 that is coupled to the communication network 414. The vehicle 400 may also include a diagnostic port 416 that is coupled to the gateway module 418. The gateway module 418 may isolate the communication network 414 from the diagnostic port 416 and may act as a firewall to limit access to the communication network 414 from the diagnostic port 416. In some configurations, the gateway module 418 may convert various communication network protocols to a protocol that is compatible with the diagnostic tool 450. The gateway module 418 may be configured to route messages to the appropriate communication network. The diagnostic tool 450 may include a vehicle interface 460 that is configured to interface with the communication network 414 to send commands and receive data from the controllers 410, 412 in the vehicle 400. The diagnostic tool 450 may include a user interface 458 that is configured to display information to the user and accept user commands.

The controller 454 may be configured to demodulate signals from the antenna 452 according to a selected carrier frequency. The selected carrier frequency may correspond to predetermined frequencies associated with electromagnetic emissions from communication networks 414 within the vehicle 400. The controller 454 may output the demodulated signal to the speaker 456 for analysis by the user. The controller 454 functions may be similar to those described previously. For example, the controller 454 may be configured to provide an automated test mode for all of the vehicle communication networks. In some configurations, the vehicle interface 460 may be configured to selectively couple the conductors of the communication network 414 to a generally constant voltage level to reduce radiated emissions. The controller 454 may be configured to request the first controller 410 and/or the second controller 412 to selectively disable communication on the communication network 414 (selectively shorting conductors to predetermined voltage level).

Figure 5:
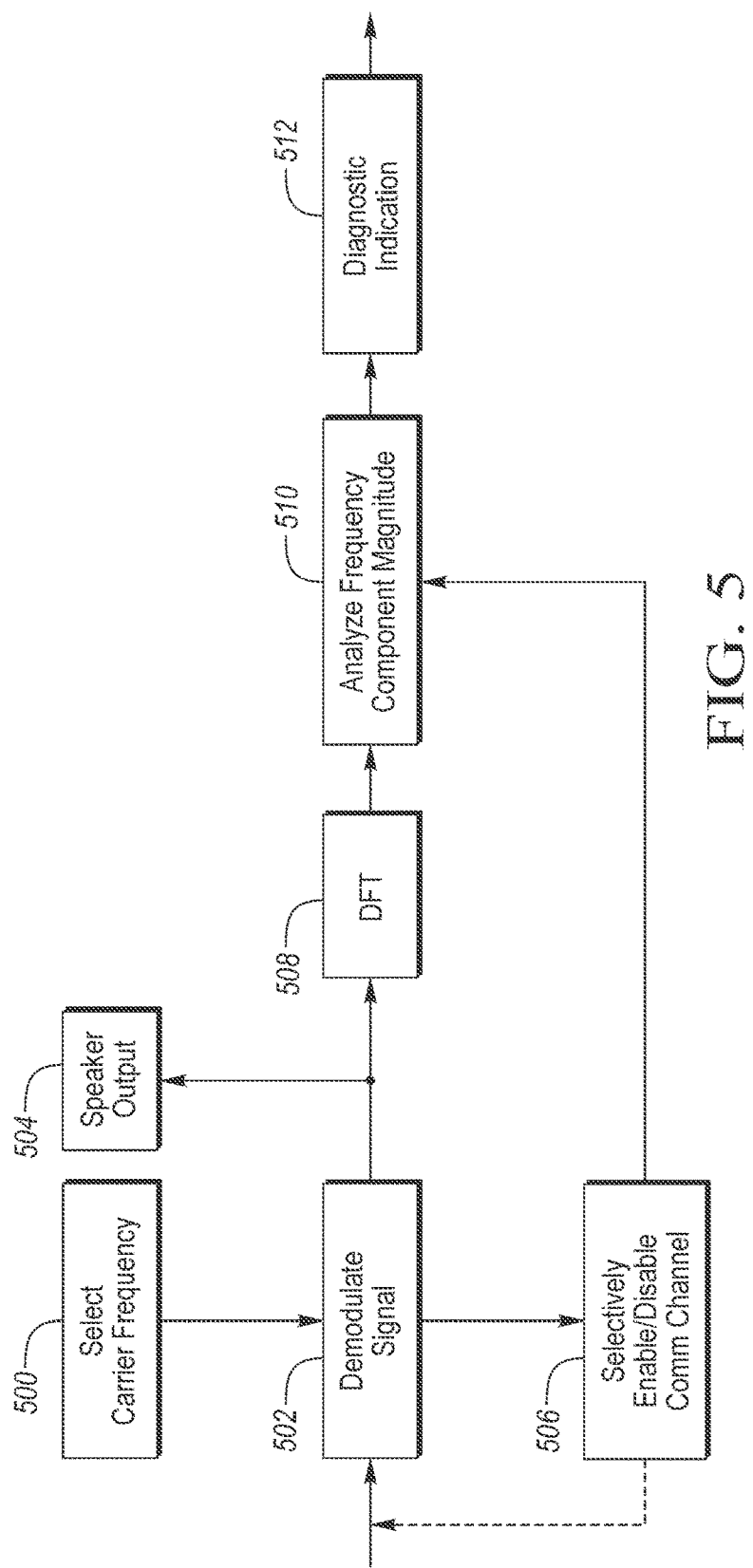
FIG. 5 depicts a block diagram for a controller implemented process for detecting radiated emissions from communication networks in the vehicle.

FIG. 5 depicts a block diagram for a controller implemented control system to provide a diagnostic indication. At block 500, the carrier frequency is selected. The carrier frequency may by user selected and may correspond to an expected radiated emissions frequency from a communication network in the vehicle. At block 506, the communication network may be selectively enabled or disabled which may affect an incoming signal from the antenna. At block 502, the incoming signal from the antenna is demodulated to provide a signal for audio output. At block 504, the signal is output to the speakers. When the communication network is disabled, the audio signal may be a baseline audio signature. When the communication network is enabled, the audio signal may include a disturbance distinct from the baseline audio signature. The communication network may be alternately enabled and disabled during the diagnostic request. The service technician may listen to the resulting audio signals to ascertain if a disturbance is present in the audio output. At block 508, the signal may be processed for frequency component magnitudes at a range of frequencies using a discrete Fourier transform. At block 510, the frequency component magnitudes are analyzed. A first set of frequency component magnitudes may correspond to the communication network being disabled and a second set of frequency component magnitudes may correspond to the communication network being enabled. At block 512, the frequency component magnitudes may be compared and a diagnostic indicator may be output when at least one frequency component magnitude of the second set exceeds the corresponding frequency component magnitude of the first set by more than a predetermined amount.

The systems and methods described may aid in diagnosing vehicle communication networks. In some configurations, the communication network may be identified with some level of confidence. This allows a service technician to quickly identify and resolve communication network issues.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:
1. An automotive diagnostic tool comprising:
a controller configured to output, to a speaker, an audio signal derived from an antenna signal demodulated at a frequency in a predetermined range corresponding to electromagnetic emissions caused by a differential signal channel being imbalanced and cause a vehicle controller to operate the differential signal channel to alternate between periods of signal activity and periods of signal inactivity causing corresponding audio signatures in the audio signal.

2. The automotive diagnostic tool of claim 1 further comprising a display, wherein the controller is programmed to output a message indicative of the differential signal channel being operated.

3. The automotive diagnostic tool of claim 1 wherein the vehicle controller operates the differential signal channel during periods of signal inactivity by maintaining conductors of the differential signal channel at a generally constant voltage level to minimize electromagnetic emissions from the differential signal channel.

4. The automotive diagnostic tool of claim 1 wherein the corresponding audio signatures include a baseline audio signature that results from the differential signal channel during period of signal inactivity.

5. The automotive diagnostic tool of claim 1 wherein the corresponding audio signatures include an audio signature that results from the differential signal channel during periods of signal activity.

6. The automotive diagnostic tool of claim 1 wherein the controller is further programmed to request the vehicle controller to transmit a predetermined signal over the differential signal channel during periods of signal activity, wherein the predetermined signal is configured to cause electromagnetic emissions in the predetermined range when the differential signal channel is imbalanced.

7. The automotive diagnostic tool of claim 1 wherein the controller is further programmed to request the vehicle controller maintain the periods of signal inactivity of the differential signal channel for a first predetermined time interval and maintain the periods of signal activity of the differential signal channel for a second predetermined time interval.

8. The automotive diagnostic tool of claim 1 wherein the controller is further configured to change the frequency in predetermined increments within the predetermined range at predetermined time intervals.

9. An automotive diagnostic tool comprising:
a controller configured to generate an audio signal by demodulating an antenna signal at a frequency in a predetermined range corresponding to electromagnetic emissions caused by an imbalance of a differential signal channel, communicate with a vehicle controller to alternately enable and disable the differential signal channel in a vehicle such that the channel alternates between a period of signal activity resulting in an audio signature and a period of signal inactivity resulting in a baseline audio signature, and output a diagnostic signal responsive to identifying a presence of a disturbance in the audio signature that is absent from the baseline audio signature.

10. The automotive diagnostic tool of claim 9 wherein the controller is further programmed to identify the presence of the disturbance by processing the audio signature and the baseline audio signature using a discrete Fourier transform to generate frequency component magnitudes for frequencies present in the audio signature and the baseline audio signature.

11. The automotive diagnostic tool of claim 9 wherein the period of signal inactivity is a period in which conductors of the differential signal channel are maintained at a generally constant voltage level to eliminate electromagnetic emissions from the differential signal channel.

12. The automotive diagnostic tool of claim 9 wherein the controller is further programmed to generate a first set of frequency component magnitudes that correspond to the baseline audio signature when the differential signal channel is selectively disabled and a second set of frequency component magnitudes that correspond to the audio signature that results when the differential signal channel is selectively enabled.

13. The automotive diagnostic tool of claim 12 wherein the controller is further programmed to output the diagnostic signal in response to one or more frequency component magnitudes of the second set being greater than corresponding frequency component magnitudes of the first set by greater than a predetermined amount.

14. The automotive diagnostic tool of claim 9 wherein the controller is further programmed to request the vehicle controller to transmit a predetermined signal over the differential signal channel when enabled, wherein the predetermined signal is configured to cause electromagnetic emissions in the predetermined range in a presence of the imbalance.

15. A method for diagnosing wiring issues in a vehicle comprising:
demodulating by a controller an antenna signal at a frequency in a predetermined range corresponding to electromagnetic emissions caused by an imbalance of a differential signal channel;
requesting by the controller a vehicle controller to operate the differential signal channel during alternating time periods such that the differential signal channel alternates between a period of signal activity to cause an audio signature and a period of signal inactivity to cause a baseline audio signature; and
outputting by the controller to a speaker during alternating time periods the baseline audio signature and the audio signature that includes, when the differential signal channel is imbalanced, a disturbance distinct from the baseline audio signature.

16. The method of claim 15 further comprising identifying by the controller a presence of the disturbance in the audio signature that is absent from the baseline audio signature collected when the differential signal channel is balanced.

17. The method of claim 16 further comprising processing by the controller the audio signature and the baseline audio signature using a discrete Fourier transform to generate frequency component magnitudes for frequencies present in the audio signature and the baseline audio signature.

18. The method of claim 17 further comprising outputting by the controller a diagnostic signal in response to one or more frequency component magnitudes of a first set of frequency component magnitudes, that correspond to the baseline audio signature when the differential signal channel is selectively disabled, being greater than corresponding frequency component magnitudes of a second set of frequency component magnitudes, that correspond to the audio signature that results when the differential signal channel is selectively enabled, by greater than a predetermined amount.

19. The method of claim 15 further comprising maintaining by the vehicle controller conductors of the differential signal channel at a generally constant voltage level to minimize electromagnetic emissions from the differential signal channel during the period of signal inactivity to cause the baseline audio signature.

20. The method of claim 15 further comprising requesting by the controller the vehicle controller to transmit a predetermined signal over the differential signal channel during the period of signal activity, wherein the predetermined signal is configured to cause electromagnetic emissions in the predetermined range in a presence of the imbalance.

* * * * *